(12) United States Patent
Aschenbrenner et al.

(10) Patent No.: US 6,284,639 B1
(45) Date of Patent: Sep. 4, 2001

(54) METHOD FOR FORMING A STRUCTURED METALLIZATION ON A SEMICONDUCTOR WAFER

(75) Inventors: Rolf Aschenbrenner; Ghassem Azdasht, both of Berlin; Elke Zakel, Falkensee; Andreas Ostmann; Gerald Motulla, both of Berlin, all of (DE)

(73) Assignee: Fraunhofer-Gesellschaft zur Foerderung der Angwandten Forschung E.V., Munich (DE)

( * ) Notice: Subject to any disclaimer, the term of this patent is extended or adjusted under 35 U.S.C. 154(b) by 0 days.

(21) Appl. No.: 09/367,462

(22) PCT Filed: Sep. 23, 1999

(86) PCT No.: PCT/EP98/00618

§ 371 Date: Oct. 25, 1999

§ 102(e) Date: Oct. 25, 1999

(87) PCT Pub. No.: WO98/36447

PCT Pub. Date: Aug. 2, 1998

(30) Foreign Application Priority Data

Feb. 14, 1997 (DE) .............................................. 197 05 745

(51) Int. Cl.[7] ........................ H01L 21/44; H01L 21/4763
(52) U.S. Cl. ......................... 438/612; 438/613; 438/614; 438/618; 438/677; 438/678
(58) Field of Search ................................... 438/612–618, 438/678, 677; 257/735–738, 779, 784

(56) References Cited

U.S. PATENT DOCUMENTS

| 4,448,804 | 5/1984 | Amelio et al. | 427/98 |
| 5,266,446 | * 11/1993 | Chang et al. | 430/314 |
| 5,445,994 | 8/1995 | Gilton | 437/183 |

FOREIGN PATENT DOCUMENTS

| 3138474 | 4/1983 | (DE) | C23C/3/02 |
| 19500655 | 7/1996 | (DE) | H01L/23/50 |
| 0151413 | 1/1984 | (EP) | C23C/18/18 |

OTHER PUBLICATIONS

J. Electrochem. Soc.; 1989, vol. 136, Nr. 2, pp. 456–462. Ting & Paunovic, "Selective Electroless Metal Deposition for Integrated Circuit Fabrication", No date.

Aschenbrenner et al., Electroless Nickel/Copper plating as a new bump metallization, IEEE Transactions on Components, Packaging, and Manufacturing Technology—Part B, 1995, vol. 18, Nr. 2, pp. 334–338.

JP 4–206680 A. In: Pat. Abstract of JP E–1289, no date.

\* cited by examiner

*Primary Examiner*—Jey Tsai
*Assistant Examiner*—Ha Tran Nguyen
(74) *Attorney, Agent, or Firm*—Michael A. Glenn

(57) ABSTRACT

The present invention relates to a method of forming a structured metallization on a semiconductor wafer, wherein a main surface of the wafer has a passivation layer applied thereto, which is structured so as to determine at least one bond pad. Initially, a metal bump is produced on the at least one bond pad. An activated dielectric is then produced on the areas of the passivation layer on which the structured metallization is to be formed. Finally, metal is chemically deposited directly on the activated dielectric and on the metal bump in such a way that the structured metallization formed on the activated dielectric and the metal chemically deposited on the metal bump are electro-conductively joined.

15 Claims, 3 Drawing Sheets

METHOD FOR FORMING A STRUCTURED METALLIZATION ON A SEMICONDUCTOR WAFER

This application is a 371 of application PCT/EP98/00618 filed on Feb. 05, 1998.

BACKGROUND OF THE INVENTION

1. Field of the Invention

The present invention relates to a method of forming a structured metallization on a semiconductor wafer and especially to methods which are suitable for producing a rewired area on a chip surface.

2. Description of Prior Art

The increasing degree of miniaturization of electronic systems necessitates that the chip housings become smaller and smaller. An optimum utilization of the printed circuit board surface can only be achieved by the use of flip-chip mounting for unhoused chips.

The pad arrangement and the pitch of presently available chips are limited by the possibilities of wire bonding technology, since, in the foreseeable future, most of the chips will be used in a housed form. Hence, a very small pitch and also very small pad areas are used for high-pole chips. Pad sizes of 80×80 Îm and a pitch of 100 Îm are normally used. In the case of configurations which are so small, contacting by bonding wires can be realized, but the classic flip-chip technique cannot be used for this purpose.

When the above-mentioned fine pitch is used, a large number of problems arises with regard to the classic flip-chip technique. These problems concern solder bridges between neighbouring solder bumps, solder-stop lacquer openings on the printed circuit board as well as the equipment for the ultrafine distances (pitch).

In order to avoid the above-mentioned problems, chip housings are known in the field of technology in the case of which the connections of the chip are rearranged in such a way that a planar configuration is obtained. An example of such a planar arrangement is shown in FIG. 1 where a plurality of marginal pads, reference numeral 10, are rewired thus forming a corresponding plurality of pads in a planar arrangement, reference numeral 12. A further example of rewiring is e.g. the rewiring of two pads on a chip to form very large bumps, which are arranged on a chip surface, such very large bumps being referred to as megabumps in the field of technology.

There are various possibilities of realizing a rewiring technique on the chip surface for changing the bump geometry and the connections, and a distribution of the connections from the edge of the chip such that a planar distribution is obtained. According to the prior art, metallization layers are electrodeposited, the metallization layers being then structured by photolithography, whereupon the metallization areas which are not required are etched. The full-area deposition of metal can be carried out not only by electrodeposition but also by vapour deposition.

According to the conventional rewiring method, the following sequence of process steps takes place. Initially, a photo-structurable dielectric is applied to a main surface of a semiconductor wafer with a passivation layer for defining bond pads. Subsequently, the bond pads in the dielectric are opened. Following this, a sputtering process is carried out for producing a full-area metallization on the wafer, i.e. on the bond pads and on the dielectric. The full-area metallization is then structured making use of a photoresist mask, whereby the rewiring metallization is defined. An electrodeposition of metal is then carried out on the thus defined thin metallization. Following this, the residual photoresist mask is removed and the base metallization is subjected to selective etching. Finally, a solder resist mask, which defines the planar pads, is applied to the surface of the wafer.

Primarily the costs for the sputtering equipment, which are normally very high, represent a disadvantage of the known method. Furthermore, when the full-area metallization has been produced on the wafer, a further photolithographic method must be carried out making use of a photoresist mask. The known method is therefore comparatively complicated.

EP-A-0151413 refers to methods of selective currentless metal deposition on dielectric surfaces. In the case of these methods a dielectric surface is treated by activating preselected areas of the surface by means of a pretreatment solution, e.g. a palladium-chloride solution, whereupon a currentless metal deposition is carried out on the activated areas.

J. Electrochem. Soc. 1989, Vol. 136, No.2, pp. 456–462, disclose methods of selective currentless metal deposition, which are used in the production of integrated circuits and especially for producing multilevel interconnections in VLSI circuits. These methods comprise the step of forming conductor patterns by depositing first a thin aluminium layer on an $SiO_2$ surface so as to form an adhesive layer between the future metallization and the $SiO_2$ layer. Following this, a currentless metal deposition is carried out, e.g. by means of a suitable mask, for producing the desired conductor patterns.

IEEE Transactions on Components, Packaging, and Manufacturing Technology, Part B, 1995, Vol. 18, No. 2, pp. 334–338, described methods for currentless nickel/copper deposition on bond pads of a silicon wafer provided with a passivation layer, the nickel/copper being deposited for producing metal bumps.

JP-A-206680 discloses the formation of a layer of an activated dielectric material on a substrate for performing then a currentless deposition of metal layers on lateral surfaces of the activated dielectric material. In order to prevent a deposition on the surface of the activated dielectric material extending parallel to the substrate, a layer of inactive dielectric material is applied to this surface.

SUMMARY OF THE INVENTION

It is the object of the present invention to provide methods for forming a structured metallization on a semiconductor wafer, especially for permitting connections on the edges of the wafer to be rewired such that a planar configuration is obtained, the methods being simpler, faster and less expensive than known methods.

In accordance with a first aspect of the present invention, this object is achieved by a method of forming a structured metallization on a semiconductor wafer, a main surface of said wafer having a passivation layer applied thereto, which is structured so as to determine at least one bond pad, said method comprising the following steps:

a1) producing a metal bump on said at least one bond pad;

b1) producing an activated dielectric on the areas of the passivation layer on which the structured metallization is to be formed; and c1) chemically depositing metal directly on the activated dielectric and the metal bump in such a way that the structured metallization formed on the activated dielectric and the metal chemically deposited on the metal bump are electroconductively joined.

In accordance with a second aspect of the present invention, this object is achieved by a method of forming a structured metallization on a semiconductor wafer, a main surface of said wafer having a passivation layer applied thereto, which is structured so as to determine at least one bond pad, said method comprising the following steps:

a2) producing an activated dielectric on the areas of the passivation layer on which the structured metallization is to be formed, and activating the at least one bond pad;

b2) chemically depositing metal directly on the activated areas and the activated bond pad in such a way that the structured metallization formed on the activated dielectric and the metal chemically deposited on the metal bump are electroconductively joined.

The present invention is based on the idea of providing a deposition and structuring method based on the selective chemical deposition of metal on a suitably seeded substrate, and on the structured application of a conductive material, respectively. For this purpose, the wafers have applied thereto an activated dielectric for an additive chemical deposition, or a conductive material.

The above-mentioned materials, i.e. the activated dielectric or a conductive material, can be realized e.g. by application by means of a stencil, dispensing, full-area application and subsequent photolithographic structuring thereof, as well as by full-area application and activation of the areas to be metallized by means of exposure.

The present invention refers to methods for forming a structured metallization on the surface of a semiconductor wafer having already applied thereto a passivation layer which is structured so as to define at least one bond pad. Such bond pads are normally realized as aluminium bond pads.

When the method according to the present invention is used for rewiring edge pads on a chip such that a planar configuration of the pads is obtained, a solder-stop lacquer is applied, after the chemical metal deposition, to the surface of the wafer having the structured metallization formed thereon, whereupon openings for the planar pad arrangement are formed in the solder-stop lacquer.

It follows that the present invention provides methods of forming a structured metallization on a semiconductor wafer, especially for rewiring, which do not necessitate the use of an expensive sputtering device. Furthermore, in comparison with known methods, the methods according to the present invention can be carried out more simply and more rapidly, and this will reduce the costs still further.

BRIEF DESCRIPTION OF THE DRAWINGS

In the following, preferred embodiments of the present invention will be explained in detail making reference to the drawings enclosed, in which.

Figure 1:
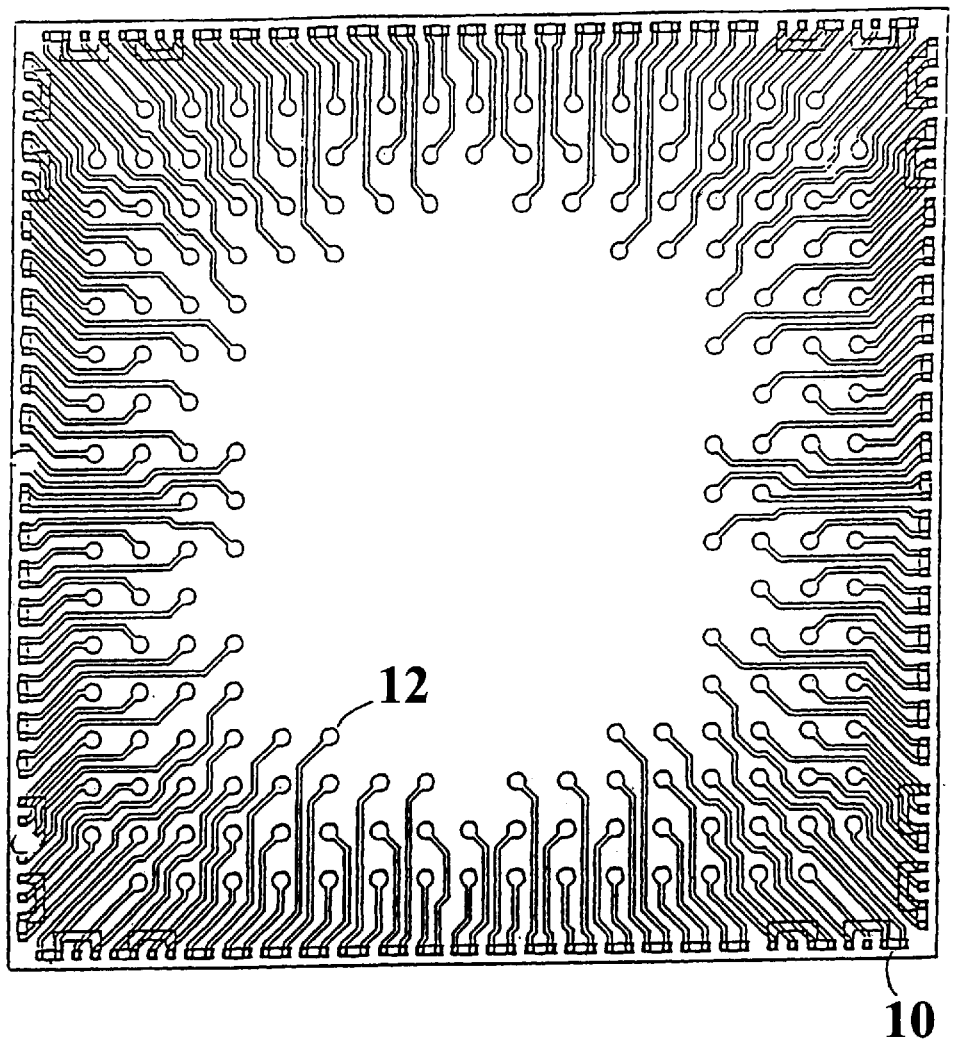
FIG. 1 shows a top view of an exemplary rewiring of edge pads such that a planar pad configuration is obtained.

DESCRIPTION OF PREFERRED
EMBODIMENTS OF THE INVENTION

Reference should here be made to the fact that in all figures like reference numerals have been used to designate identical elements.

Figure 2A:
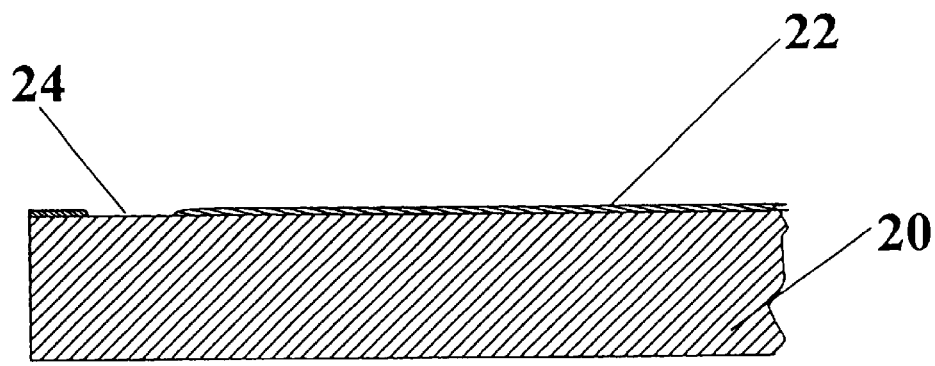
FIG. 2a) to d) show schematic cross-sectional views for explaining the method according to the first aspect of the present invention.

FIG. 2a) and 3a) each show a schematic cross-sectional view of part of a semiconductor wafer representing the starting point of the method according to the present invention. A semiconductor wafer 20 is provided with a passivation layer 22 on a main surface thereof. Bond pads 24 are arranged in the passivation layer 22. These bond pads 24 are normally implemented as aluminium bond pads. The semiconductor wafer 20 consists preferably of silicon, the passivation layer 22 consisting of silicon nitride. Such a semiconductor structure can be obtained from semiconductor manufacturers in this form.

Figure 2B:
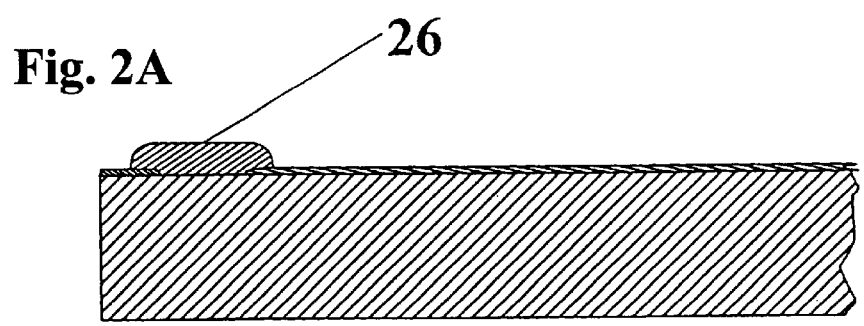

Making reference to FIG. 2, a preferred embodiment of the method according to the first aspect of the present invention will be explained in detail in the following. Taking as a basis the starting substrate shown in FIG. 2a), a chemical, i.e. currentless metal deposition on the aluminium bond pad 24 is first carried out. By means of this deposition, a metal bump 26 is produced on the bond pad 24, as can be seen in FIG. 2b). It is apparent that, in accordance with an arbitrary number of bond pads on the semiconductor wafer, a large number of metal bumps can be produced in this step. In order to realize the chemical metal deposition, the aluminium bond pads must first be subjected to an activation, e.g. a palladium activation.

In addition to chemical metal deposition, also photolithographic processes making use of a photoresist can be used for producing the metal bumps.

According to the present embodiment, a dielectric is now applied to the passivation 22 of the wafer 20; this application can be carried out by means of stencil printing (mask printing) or, alternatively, over the full area with subsequent photolithographic structuring. Full-area application of the dielectric comprises the steps of applying a photomask in the manner known, exposing the bond pad and the structures, which are not intended to constitute conductor paths later on, and, subsequently, removing the exposed areas.

Figure 2C:
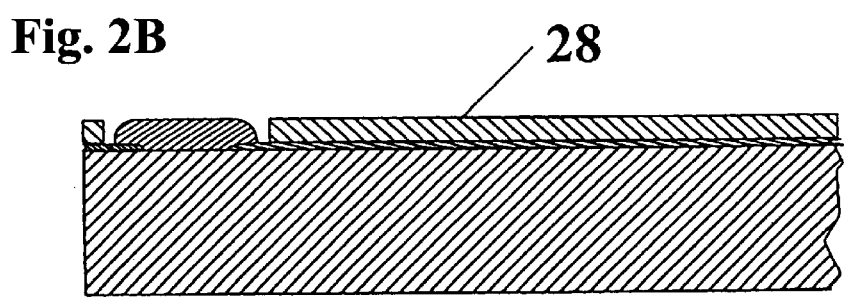
Figure 2D:
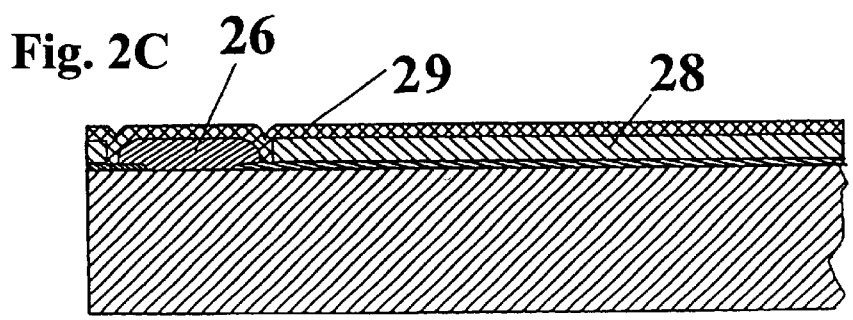

FIG. 2c) shows the structure after the structuring of the dielectric 28. The metal bump 26 and the dielectric 28 should only be separated by a small distance. Alternatively, the metal bump and the dielectric 28 may slightly contact each other. The dielectric 28 can, when applied, already be activated for a subsequent chemical metallization, e.g. by palladium particles. Alternatively, the dielectric can be seeded in a wet-chemical process, e.g. by immersion in a palladium-chloride solution, after its application.

As can be seen in FIG. 2c), the dielectric 28 has the same height as the metal bump 26. This can be realized by adjusting the application thickness of the dielectric depending on the sequence of process steps used. It is, however, also possible that the dielectric 28, when applied, exceeds the metal bump 26 in height, and, in this case, it will be necessary to etch the dielectric back to the height of the metal bump after the application of the dielectric.

In a subsequent step, a chemical metal deposition is carried out on the activated dielectric. In this chemical metal deposition, gold, nickel, copper or palladium are deposited on the activated dielectric and the metal bump in a currentless deposition process so as to form a metallization layer 29. The chemically deposited metal and the metal bump grow together thus forming an electrically conductive connection from the metal bump to the metallization layer arranged on the dielectric 28, whereby the electric connection from the bond pad to the rewired area is realized. In the preferred embodiment, a solder-stop lacquer with openings for the planar pad arrangement is subsequently applied, the pads of the pad arrangement being connected e.g. with edge pads by the method according to the present invention.

Alternatively, the activated dielectric can be produced on the areas of the passivation layer on which the structured metallization is to be formed, by applying the dielectric over the full area with the exception of the metal bumps and by activating the areas to be metallized by exposure.

Figure 3A:
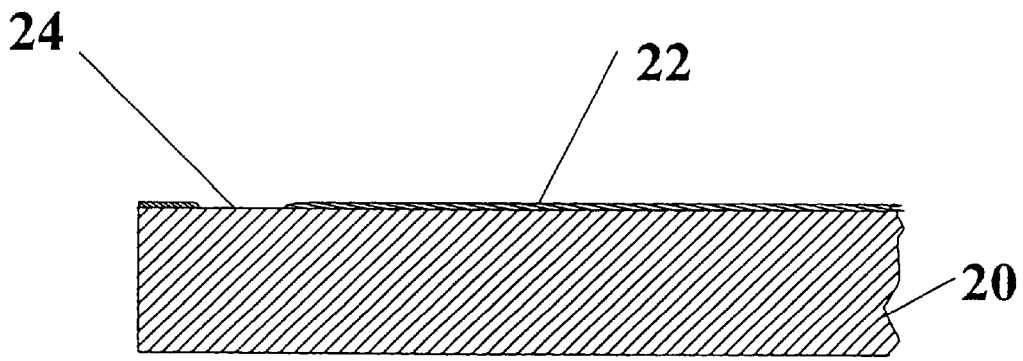
FIG. 3a) to c) show schematic cross-sectional views for explaining the method according to the second aspect of the present invention.
Figure 3B:
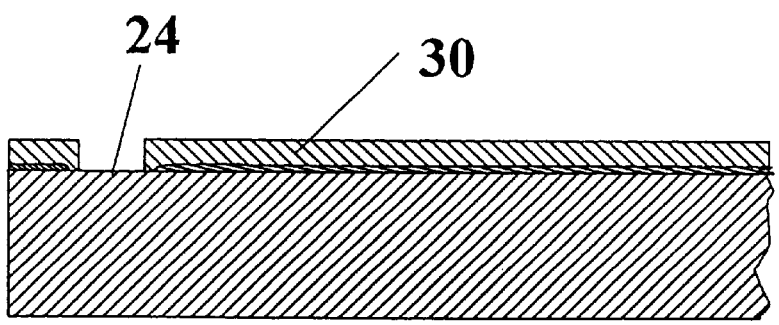
Figure 3C:
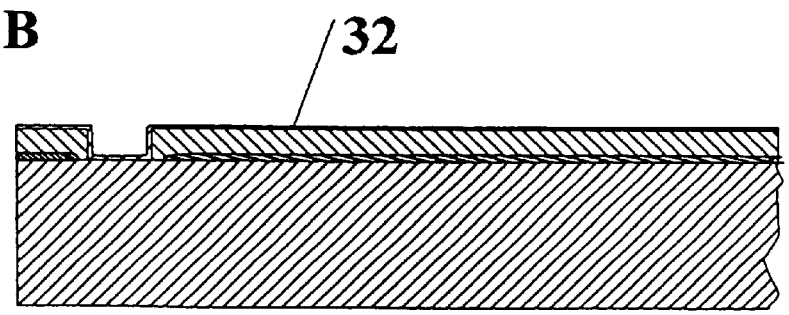

Making reference to FIG. 3, a preferred embodiment of the method according to the second aspect of the present invention will be explained in the following. FIG. 3a) again shows the starting wafer 20 with the passivation layer 22 and the bond pad 24. A dielectric 30 is applied over the full surface of the wafer 20 on which the passivation layer 22 is arranged. The dielectric 30 is structured, e.g. by means of a photolithograpphic process, on the one hand for uncovering the bond pad 24, and, on the other hand, for defining the structure of the metallization which is to be applied later on. The resultant structure is shown in FIG. 3b). Subsequently, the dielectric 30 and the bond pad 24 are seeded preferably in a wet-chemical process, i.e. by immersing the wafer in a palladium-chloride solution. A metallization layer 32 is applied to the now existing structure by means of chemical metal deposition. The metallization layer is deposited on the activated dielectric and on the activated bond pads 24 by the chemical metal deposition, as can be seen in FIG. 3c). By means of the hod described with regard to FIG. 3, a contact can be established, in one step and without any metal bump, between metal layer deposited on the dielectric and the bond pad 24.

The methods according to the present invention are advantageous when a rewired area is produced on a chip. In comparison with known methods, the present invention permits such rewired areas to be realized at a more moderate price and more rapidly, the number of process steps required being simultaneously reduced.

What is claimed is:

1. A method of forming a structured metallization on a semiconductor wafer, a main surface of said wafer having a passivation layer applied thereto, which is structured so as to determine at least one bond pad, said method comprising the following steps:
    a1) producing a metal bump on said at least one bond pad;
    b1) producing an activated dielectric on areas of the passivation layer on which the structured metallization is to be formed; and
    c1) chemically depositing metal directly on the activated dielectric and the metal bump in such a way that the structured metallization formed on the activated dielectric and the metal chemically deposited on the metal bump are electroconductively joined.

2. A method according to claim 1, wherein in step a1) the metal bump is formed by chemically depositing metal on the at least one bond pad.

3. A method according to claim 1, wherein in step a1) the metal bump is formed by means of photolithographic processes on the at least one bond pad.

4. A method according to claim 1, wherein in step b1) the dielectric is first fully applied over said areas and then structured by means of photolithographic processes.

5. A method according to claim 4, wherein the applied dielectric contains palladium particles.

6. A method according to claim 4, wherein, after having been structured, the dielectric is activated by immersion in a palladium-chloride solution.

7. A method according to claim 1, wherein gold, nickel, copper or palladium is deposited in the chemical metal deposition process.

8. A method according to claim 1 for rewiring pad areas on a wafer so as to form a planar arrangement, wherein, after the chemical metal deposition, a solder-stop lacquer is applied to the surface of the wafer on which the structured metallization is formed, whereupon openings for the planar pad arrangement are formed in said solder-stop lacquer.

9. A method of forming a structured metallization on a semiconductor wafer, a main surface of said wafer having a passivation layer applied thereto, which is structured so as to determine at least one bond pad, said method comprising the following steps:
    a2) producing an activated dielectric on areas of the passivation layer on which the structured metallization is to be formed, and activating the at least one bond pad;
    b2) selectively chemically depositing metal directly on both the activated areas and the activated bond pad in a common process step in such a way that the structured metallization formed on the activated dielectric and the metal chemically deposited on the activated bond pad are electroconductively joined.

10. A method according to claim 9, wherein in step a2) the dielectric is first applied over a full area and then structured by means of photolithographic processes.

11. A method of forming a structured metallization on a semiconductor wafer, a main surface of said wafer having a passivation layer applied thereto, which is structured so as to determine at least one bond pad, said method comprising the following steps:
    a2) producing an activated dielectric on areas of said passivation layer on which said structured metallization is to be formed, and activating said at least one bond pad, wherein said dielectric is first fully applied over said areas and then structured by means of photolithographic processes, said dielectric containing palladium particles; and
    b2) chemically depositing metal directly on said activated areas and the activated bond pad in such a way that said structured metallization formed on said activated dielectric and said metal chemically deposited on said metal bump are electroconductively joined.

12. A method according to claim 11, wherein said immersion in the palladium-chloride solution has the effect that the at least one bond pad is additionally activated.

13. A method according to claim 10, wherein, after having been structured, the dielectric is activated by immersion in a palladium-chloride solution.

14. A method according to claim 9, wherein gold, nickel, copper or palladium is deposited in the chemical metal deposition process.

15. A method of forming a structured metallization on a semiconductor wafer, a main surface of said wafer having a passivation layer applied thereto, which is structured so as to determine at least one bond pad, said method comprising the following steps:
    producing an activated dielectric on areas of said passivation layer on which said structured metallization is to be formed, and activating said at least one bond pad;
    chemically depositing metal directly on said activated areas and the activated bond pad in such a way that said structured metallization formed on said activated dielectric and said metal chemically deposited on said metal bump are electroconductively joined; and
    rewiring pad areas on said wafer so as to form a planar arrangement, wherein, after the chemical metal deposition, a solder-stop lacquer is applied to the surface of the wafer on which the structured metallization is formed, whereupon openings for the planar pad arrangement are formed in said solder-stop lacquer.

* * * * *

UNITED STATES PATENT AND TRADEMARK OFFICE
CERTIFICATE OF CORRECTION

PATENT NO. : 6,284,639 B1
DATED : September 4, 2001
INVENTOR(S) : Aschenbrenner et al.

It is certified that error appears in the above-identified patent and that said Letters Patent is hereby corrected as shown below:

<u>Title page,</u>
Item [73], Assignee:, please add a second assignee of -- Pac-Tech-Packaging Technologies GmbH, Nauen, Germany --.

Signed and Sealed this

Thirtieth Day of July, 2002

*Attest:*

JAMES E. ROGAN
*Attesting Officer*    *Director of the United States Patent and Trademark Office*